United States Patent
Sawyer et al.

(10) Patent No.: US 6,946,314 B2
(45) Date of Patent: ***Sep. 20, 2005

(54) METHOD FOR MICROFABRICATING STRUCTURES USING SILICON-ON-INSULATOR MATERIAL

(75) Inventors: William D. Sawyer, Arlington, MA (US); Jeffrey T. Borenstein, Holliston, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 99 days.

This patent is subject to a terminal disclaimer.

(21) Appl. No.: 10/642,315

(22) Filed: Aug. 15, 2003

(65) Prior Publication Data

US 2004/0102021 A1 May 27, 2004

Related U.S. Application Data (63) Continuation-in-part of application No. 10/038,890, filed on Jan. 2, 2002, now Pat. No. 6,673,694.
(60) Provisional application No. 60/403,796, filed on Aug. 15, 2002, and provisional application No. 60/259,282, filed on Jan. 2, 2001.

(51) Int. Cl.[7] .............................................. H01L 21/76
(52) U.S. Cl. ......................................... 438/50; 438/456
(58) Field of Search ............................ 438/48, 50, 456

(56) References Cited

U.S. PATENT DOCUMENTS

| | | | |
|---|---|---|---|
| 3,922,705 A | 11/1975 | Yerman | |
| 4,079,508 A | 3/1978 | Nunn | |
| 5,488,012 A | 1/1996 | McCarthy | |
| 5,501,893 A | 3/1996 | Laermer et al. | |
| 5,760,443 A | 6/1998 | McCarthy | |
| 6,077,721 A | 6/2000 | Fukada et al. | |
| 6,105,427 A | 8/2000 | Stewart et al. | |
| 6,171,881 B1 | 1/2001 | Fujii | |
| 6,252,294 B1 | 6/2001 | Hattori | |
| 6,277,666 B1 | 8/2001 | Hays et al. | |
| 6,291,875 B1 * | 9/2001 | Clark et al. | ................ 257/622 |
| 6,423,563 B2 | 7/2002 | Fukada | |
| 6,431,714 B1 | 8/2002 | Sawada et al. | |
| 6,433,401 B1 * | 8/2002 | Clark et al. | ................ 257/524 |
| 6,458,615 B1 | 10/2002 | Fedder et al. | |

OTHER PUBLICATIONS

Moore DF, "Silicon–on insulator material for sensors and accelerometers" Silicon Fabricated Inertial instruments, 9/1–9/5 (Dec. 1996).

Syms RRA et al., "Surface tension powered self–assembly of 3D MOEMS devices using DRIE of bonded silicon–on–insulator wafers." IEEE Seminar on Demonstrated Micromachining Technologies for Industry, 1/1–1/6 (Mar. 2000).

Yamamoto T et al. "Capacitive accelerometer with high aspect ratio single crystalline silicon microstructure using SOI structure with polysilicon–based interconnect technique." Micro Electro Mechanical Systems, 515–519 (Jan. 2000).

Martin A. Schmidt, "Wafer–to–Wafer Bonding for Microstructure Formation", Proceedings of the IEEE, vol. 86, No. 8, Aug. 1998.

* cited by examiner

*Primary Examiner*—David S. Blum
(74) *Attorney, Agent, or Firm*—McDermott Will & Emery LLP (57) ABSTRACT

The invention provides a general fabrication method for producing MicroElectroMechanical Systems (MEMS) and related devices using Silicon-On-Insulator (SOI) wafer. The method includes providing an SOI wafer that has (i) a handle layer, (ii) a dielectric layer, and (iii) a device layer, wherein a mesa etch has been made on the device layer of the SOI wafer, providing a substrate, wherein a pattern has been etched onto the substrate, bonding the SOI wafer and the substrate together, removing the handle layer of the SOI wafer, removing the dielectric layer of the SOI wafer, then

BONDING, WAFER THINNING AND OXIDE DIELECTRIC REMOVAL performing a structural etch on the device layer of the SOI wafer to define the device.

23 Claims, 9 Drawing Sheets

1. Start Substrate Wafer

2. Deposit Masking Material

3. Pattern Masking Material

4. Etch Substrate Wafer

FIG. 1
PRIOR ART MICROFABRICATION PROCESS

FIG. 2
PROCESS STEPS PRIOR TO SUBSTRATE BONDING

FIG. 3
PROCESS STEPS FOR GLASS SUBSTRATE

FIG. 4
BONDING, WAFER THINNING AND OXIDE DIELECTRIC REMOVAL

FIG. 5
BASELINE BESOI PROCESS SEQUENCE.

FIG. 8
(a) EPITAXIAL COMB FINGERS.
(a) BASELINE BESOI COMB FINGERS

FIG. 9
PHENOMENON OF RIE LAG, WHERE NARROW TRENCHES ETCH MORE SLOWLY

METHOD FOR MICROFABRICATING STRUCTURES USING SILICON-ON-INSULATOR MATERIAL

CROSS-REFERENCE TO RELATED APPLICATIONS

This application is a continuation in part of U.S. patent application Ser. No. 10/038,890, filed on Jan. 2, 2002, now U.S. Pat. No. 6,673,694 the disclosure of which is incorporated herein by reference. U.S. patent application Ser. No. 10/038,890 claims priority to U.S. Provisional Patent Application Ser. No. 60/259,282, filed Jan. 2, 2001. The present application also claims priority of U.S. Provisional Patent Application Ser. No. 60/403,796, filed on Aug. 15, 2002.

FIELD OF THE INVENTION

The invention relates generally to MicroElectroMechanical Systems (MEMS), in particular, to methods for microfabricating MEMS devices on Silicon-On-Insulator (SOI) wafers.

BACKGROUND OF THE INVENTION

The rapidly emerging field of MicroElectroMechanical Systems (MEMS) has penetrated a wide array of applications, in areas as diverse as automotives, inertial guidance and navigation, microoptics, chemical and biological sensing, and biomedical engineering. Use of Silicon-On-Insulator (SOI) material is rapidly expanding in both microelectronic and MEMS applications, because of increasing demand for tight limits on wafer specifications, the low cost of SOI, its process flexibility, radiation hardness and compatibility with high-level integration. Significant benefits may be realized by utilizing SOI material to fabricate inertial sensors, chemical and biological sensors, optoelectronic devices, and a wide range of mechanical structures such as microfluidic and microoptical components and systems. In spite of its many advantages, however, use of SOI wafers to build MEMS devices is not widespread, largely because of difficulties in processing the material.

Prior methods for fabricating MEMS devices using a bonded handle wafer include the dissolved wafer process, in which silicon is bonded to glass and the silicon is dissolved away to reveal an etch-stop layer. This etch-stop layer typically comprises a heavily-doped boron-diffused or boron-doped epitaxial layer, but may also consist of a SiGe alloy layer. However, methods that involve the use of a heavily-boron-doped etch stop suffer in several respects, including poor process control, high defect densities, limitations on ultimate thickness of devices, and incompatibility with microelectronic device integration. Insertion of a SiGe alloy layer resolves several of these limitations, but that method suffers from relatively low deposition rates and material property issues. SOI micromachining has demonstrated that a limited number of device types may be successfully constructed, but the build quality is lacking and many design constraints exist.

The principal constraint involves the problems encountered when performing deep reactive-ion-etching (RIE) of the silicon device layer on top of the oxide interlayer; the RIE process tends to attack the underside of the silicon device layer due to charging of the dielectric layer. Steps have been taken by RIE equipment vendors to resolve this problem, and such methods have mitigated these etch effects.

This requirement has led to the development of alternative SOI processes. However, these alternative processes encounter stringent design rules related to pressure differentials across the thin oxide interlayer. Survival of the oxide interlayer is important for the success of alternative SOI processes, but no solution to this problem has previously been proposed.

Thus, there is a need in the art for a method that relieves the constraints for SOI processing.

SUMMARY OF THE INVENTION

The invention provides a general fabrication method for producing MicroElectroMechanical Systems (MEMS) and related devices using Silicon-On-Insulator (SOI) material. The method includes providing a Silicon-On-Insulator (SOI) wafer, which has (i) a handle layer, (ii) a dielectric layer, which preferably is a $SiO_2$ layer, and (iii) a device layer, wherein a mesa etch has been made on the device layer, providing a substrate (such as glass or silicon), where a pattern has been etched onto the substrate, bonding the SOI wafer to the substrate, whereby the etched device layer faces the patterned surface of the substrate, removing the handle layer of the SOI wafer, removing the dielectric layer of the SOI wafer, and etching the device layer of the SOI wafer to define the MEMS device.

The method described above is generally called Bonded and Etch Back Silicon-On-Insulator (BESOI). In the BESOI method, the structure etching is performed after the $SiO_2$ layer is removed, so that when the handle layer is removed by wet or dry etching, the $SiO_2$ layer is supported by the device layer, thus the $SiO_2$ layer can function as an etch stop, and no chemicals penetrate the $SiO_2$ layer to the device region to damage the device when the SOI wafer handle Si is removed.

In one preferred embodiment, the substrate is etched with a predetermined pattern, and a metal layer is deposited and metal runners are formed on the patterned substrate. In another preferred embodiment, instead of using a glass substrate, a second SOI wafer is provided to be used as a substrate. The highly doped device layer of the second SOI wafer is etched and patterned to form electrically conductive Silicon lines, which take the place of metal lines. The patterned device layer of the first SOI wafer is then bonded to the patterned device layer of the second SOI wafer. Then, the handle layer and the dielectric layer of the first SOI wafer are removed, and the device layer of the first SOI wafer is further etched to define the MEMS device.

The method of the invention provides (1) the ability to micromachine devices on SOI substrates without design constraints for structure spacing; etch gaps, oxide thickness or other features, and (2) a flexibility for handle wafer type and bonding process. This invention also addresses several of the previous barriers to general use of SOI material for MEMS and associated applications. First, the invention enables the use of SOI wafers to build a wide array of device types that were previously only feasible using standard boron etch stop technology. Second, the method allows for the use of RIE etch technology to produce high-quality structures on devices bonded everywhere to a silicon dioxide buried layer. Third, the invention relieves all of the design constraints previously required for SOI structures, including the spacing between structural elements, spacing between the device and the edge of the die, and special requirements for atmospheric conditions during bonding of SOI wafers to handle wafers.

The invention also provides intermediate structures in the general fabrication method. The intermediate structures are mechanically stable, though they contain internal cavities formed by the etched SOI wafer and the substrate. The cavities can be of various shapes and sizes.

In one embodiment, the intermediate structure have an access port in the substrate. The intermediate structures can be made using components with arbitrary thickness and arbitrary doping.

The invention further provides a method for making an accelerometer, using the methods of the invention.

In one preferred embodiment, the substrate is provided with access ports to equalize the pressure between the internal cavities and outside of the wafer sandwich. In another preferred embodiment, the process of bonding the SOI wafer and the substrate is performed at a pressure less than atmospheric pressure. Thus, some gas can be present in the cavities formed between the Si and the substrate, but the gas pressure is not great enough to cause devices to explode during a subsequent potassium hydroxide (KOH) etch to remove the handle layer. This step avoids the need for drilling holes in the substrate.

DETAILED DESCRIPTION OF THE INVENTION

Figure 1:
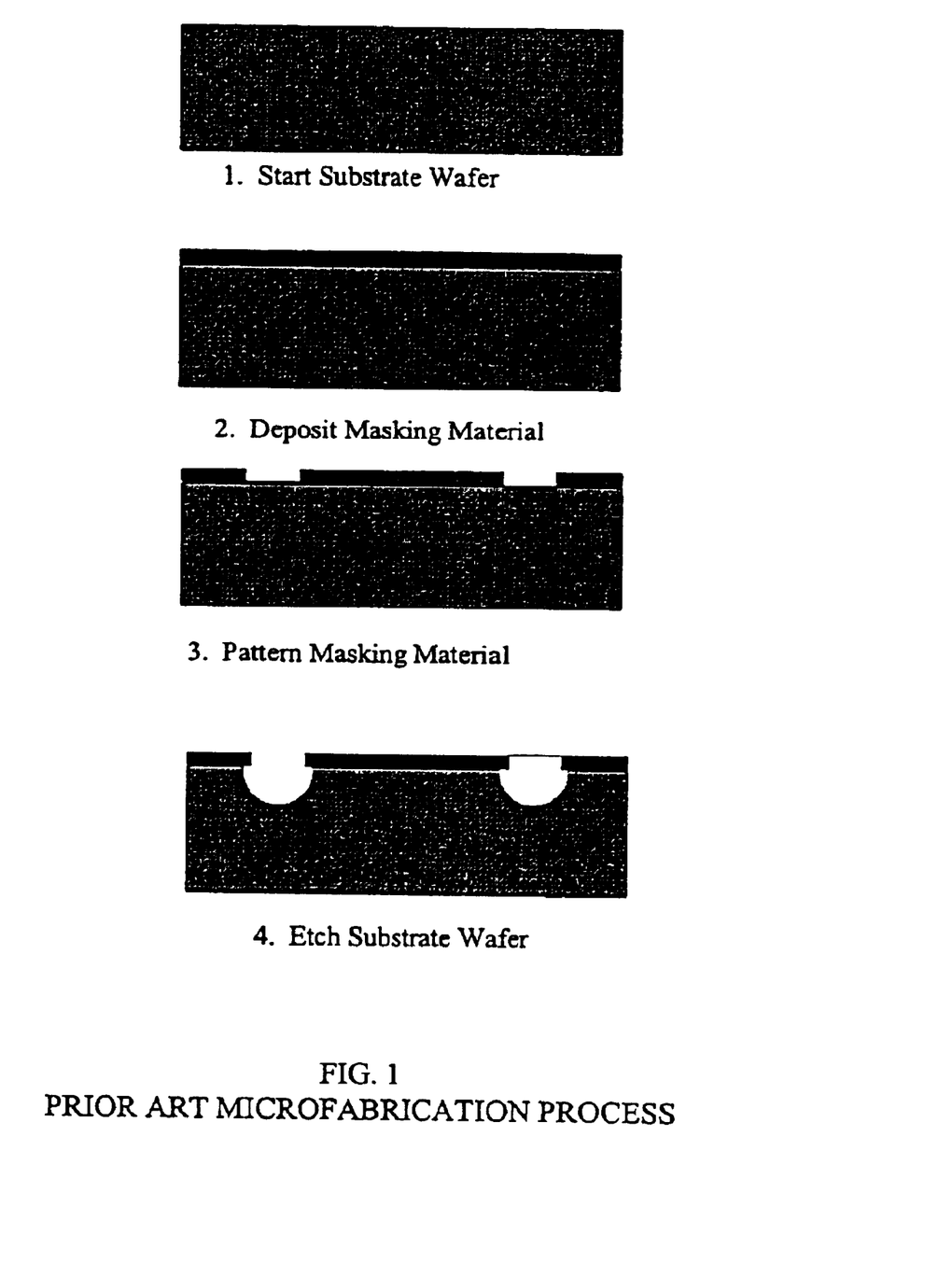
FIG. 1 is a schematic side drawing showing a prior art single depth microfabrication process.
Figure 2:
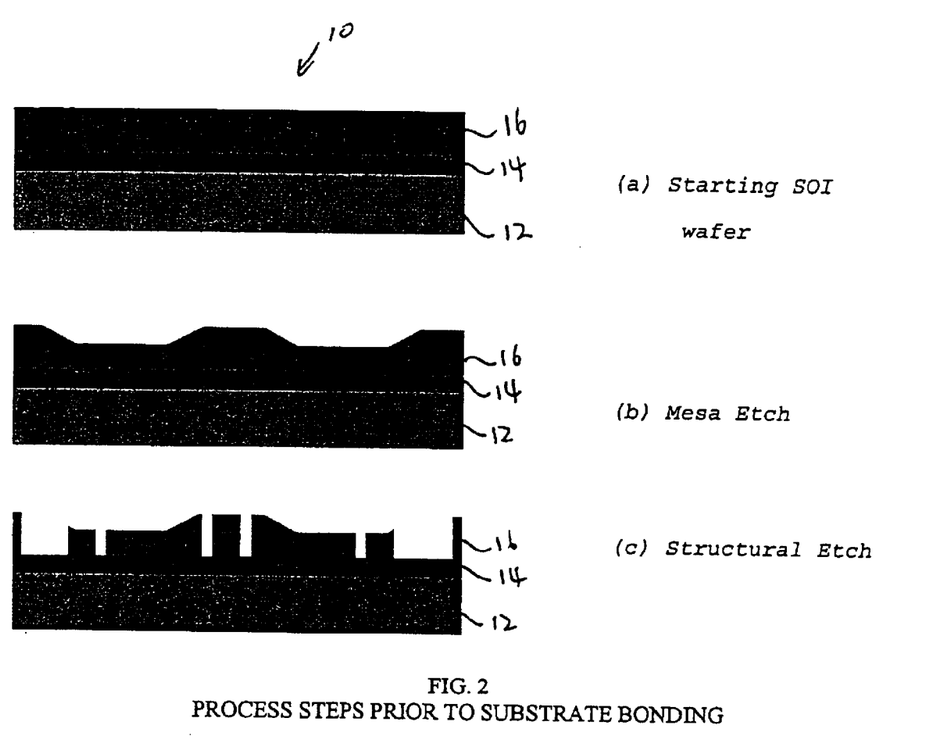
FIG. 2 is a schematic side drawing showing the process steps prior to substrate bonding.

First embodiment. An ALTSOI embodiment of the invention is now described. A standard SOI wafer 10 is provided, which is shown in FIG. 2, and which comprises a handle layer 12, a dielectric layer 14 usually consisting of silicon dioxide, and a device layer 16(see, FIG. 2a). Such wafers are commercially available from many sources, and are fabricated using wafer bonding, SIMOX technology, Smart-Cut methods, or other processes. Wafers can also be obtained from a large number of vendors of standard semiconductor material, and are sawn and polished to provide precise dimensions, uniform crystallographic orientation, and highly polished, optically flat surfaces.

Parameters for the three layers of the SOI wafer are determined by the user. Typically, the handle wafer is of sufficient thickness for handling purposes, without other requirements. The dielectric layer is thick enough for electrical isolation and effective etch-stop action, yet thin enough so as not to cause severe bowing of the SOI wafer.

The device layer parameters are important, as they will translate directly into properties of the resulting structure. Thickness of the device layer determines the device thickness (including any gap that may be machined between the device and the substrate). Electrical resistivity, carbon and oxygen content, growth technique, crystallographic orientation and other wafer parameters are selected based on the properties requited of the end product. Surface finish should be highly polished. The interface between the dielectric and device layers should not have voids.

Once the SOI wafer parameters have been selected and the material obtained, processing of the wafer begins. FIG. 2 shows the primary steps involved in preparing the SOI wafer for bonding to a substrate wafer. First the SOI wafer is cleaned and patterned for the "mesa" etch. Here mesas are preserved in the device layer and the background is etched back, so that the final structure, when bonded to a substrate, has regions which are directly bonded (the mesas) and regions suspended above the planar surface of the substrate (i.e., everywhere else on the wafer; see, FIG. 2b). The mesa etch may be performed using KOH or other etchants.

In one preferred embodiment, once the mesa etch has been performed, the wafer is cleaned and patterned for the "structural" etch (see, FIG. 2c). Typically, the structural etch is a Deep Reactive Ion Etch (DRIE) process, in which high aspect ratios may be desired (Ayon A A et al., *Mat. Res. Soc. Symp. Proc.* 546: 51 (1999); Ayon A A et al., *J. Vac. Sci. Tech.* B 18: 1412 (2000)). Since the process etches straight down to the dielectric layer, which is bonded everywhere to the device layer, techniques designed to prevent plasma etching problems at the dielectric—device interface become very effective.

The micromachining of silicon can be observed by the use of epifluorescence microscopy or by the use of metallurgic microscope. Alternatively, the micromachining can be observed by an electron microscope, such as a scanning electron microscope (SEM).

The SOI wafer that has been patterned and etched for both the mesa and structural layers is then bonded to a substrate. The substrate can be glass, silicon or other equivalently workable material.

Figure 3:
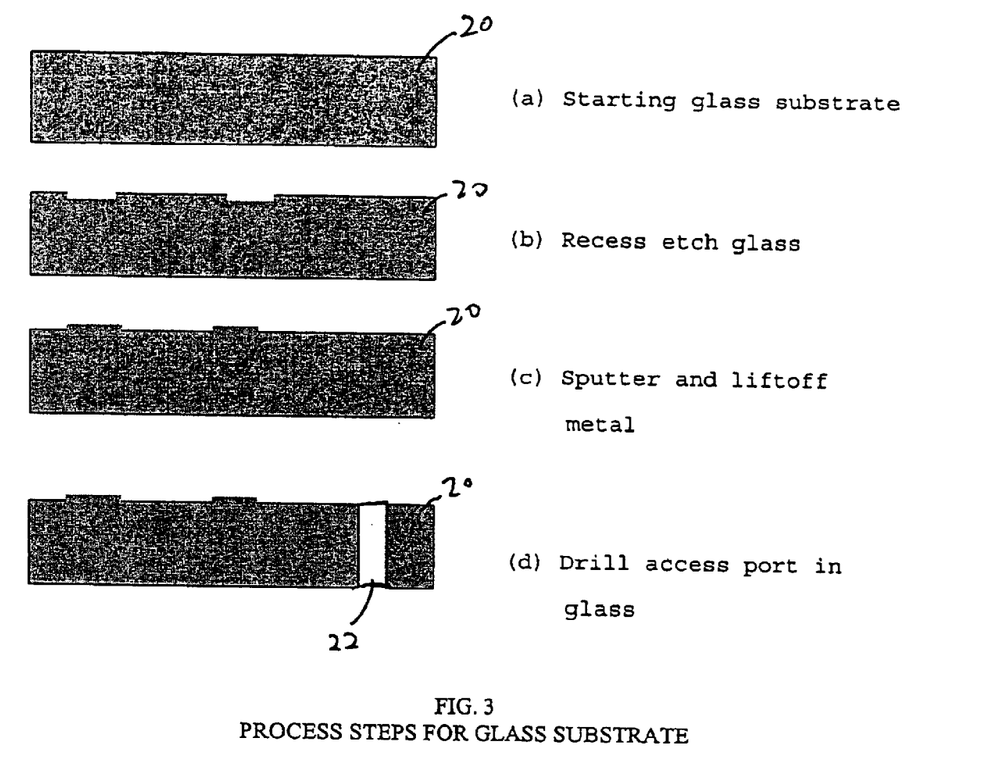
FIG. 3 is a schematic side drawing showing the process steps of the invention for glass substrate fabrication.

In one embodiment, the fabrication steps for a glass substrate 20 are those outlined in FIG. 3. First, the glass wafer 20 is cleaned and patterned for the electrode pattern. Here, the electrode pattern is composed of multilevel metallization. The glass wafer 20 is then recess-etched, and, without removing the photoresist, a blanket sputter of the multilevel metallization is performed. Finally, the wafer undergoes "lift-off", where metal not applied directly to the substrate is removed.

Note that in FIG. 3d, an additional step has been added; the formation of access ports 22 in the glass substrate 20. The advantage for this process step is described below, where the substrate wafer is bonded to the processed SOI wafer. These access ports 22 may be etched, or more preferably, mechanically or ultrasonically drilled through the glass substrate. The spacing of these holes is determined by the die size and by the presence and distribution of bonded seals between the SOI wafer and the substrate. Since the purpose of the access ports is to equalize the pressure between the internal cavities and outside of the wafer sandwich, at least one such port must be positioned within each region sealed by bonding. Typically, these regions coincide with the die size, so that each device is isolated from all others by a bonded structure known as a seal ring.

Figure 4:
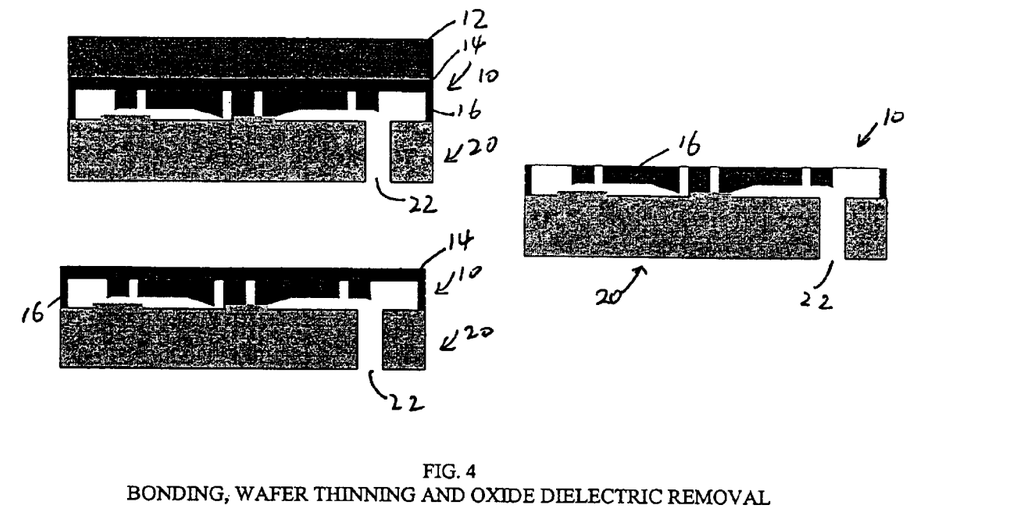
FIG. 4 is a schematic side drawing showing bonding, wafer thinning and oxide dielectric removal.

Once the SOI and glass wafers have been processed, they are bonded together. This is usually accomplished by anodic bonding. The remainder of the process sequence is illustrated in FIG. 4. Note that the presence of the access port ensures that the inner cavities are at the same pressure as the external environment.

Without the access port, the quantity of gas inside the cavity is fixed when the bond is formed. Applying the ideal gas law, the pressure inside the cavity p=nRT/V, where n is the number of moles of gas present (fixed), V is the volume of the cavity (fixed), R is the universal gas constant, and T is the temperature. If the bonding is performed at 300° C. and 1 atmosphere, for instance, the pressure inside the cavity at room temperature is (293/573) atm ~0.5 atm. Therefore, in room ambient, the cavity is in an underpressure situation, while in a vacuum chamber, it is at an overpressure situation. For any specific pressure condition during bonding, once the wafer sandwich has cooled, the pressure inside the cavity can be different from that of the outside world. Analysis indicates that such a pressure differential will lead to fracture of the oxide interlayer. Use of an access port resolves the problem of the pressure differential.

Once the wafers have been bonded together, with the device side of the SOI wafer bonded to the metallized side of the glass, the handle layer of the SOI wafer must be removed. Without an access port, this material may be removed in a wet chemical etch or by a dry plasma etch. With the access port present, only the dry process is used. For example, a RIE tool may be used to remove the handle silicon layer. One required feature of RIE process tool is that it enables the plasma removal to occur with equalized pressure across the oxide dielectric. The other required feature is that plasma gases cannot gain access to the cavity through the port; otherwise, attack of structural layers would ensue.

The final step in the process is removal of the oxide dielectric. In this as well as previous embodiments, removal of the dielectric layer must be performed using a dry plasma etch process, so as not to attack the bulk glass and metallization on the topside of the device. Once the dielectric has been removed, the final structure is produced.

This structure is expected to have excellent build quality, as it benefits from several significant process improvements: (1) high material quality through use of virgin SOI material rather than highly doped layers; (2) very high fidelity DRIE processing, due to fully bonded device and oxide dielectric layer during the etch process, and newly-developed vendor equipment and processes designed specifically for these applications; (3) high quality access port holes, drilled using ultrasonic methods which produce smooth walls without stress concentrations; (4) complete flexibility in wafer bonding process, without concern for ambient conditions and resulting pressure differentials; and (5) dry plasma etch wafer thinning process, which allows for pressure equalization across oxide dielectric, eliminating possible exposure of device layer to etchant.

One group of former methods for fabricating micromachined structures in silicon involves the use of an etch-stop such as heavily-doped boron layers or SiGe layers. The method of the invention has several distinct advantages over that family of techniques, including increased process flexibility without the requirement for heavy doping, a higher-quality silicon device layer, and improved process control.

Alternative embodiments. Alternate methods for the invention include, but are not limited to (1) the use of silicon or other crystalline substrates rather than a glass substrate, (2) anodic bonding using a thin layer of sputtered PYREX® rather than a full glass wafer, (3) fusion bonding rather than anodic bonding of the lower handle wafer, etching or other processes rather than ultrasonic drilling, (4) alternate means for removing the SOI handle layer, and (5) the use of materials other than silicon and silicon dioxide for the device layer and etch-stop layer, respectively. Wafers made from PYREX®, other borosilicate glass, or other glasses can also be procured and inserted into micromachining processes, with alternative processes used to etch the glassy materials. See, published PCT patent application WO 00/66036; Kaihara et al., *Tissue Eng* 6(2): 105–17 (April 2000).

Plasma etching provides the ability to control the width of etched features as the depth of the channel is increased. Wet chemical processes typically widen the trench substantially as the depth is increased, leading to a severe limitation on the packing density of features (Fruebauf J & Hannemann B, *Sensors and Actuators* 79: 55 (2000)). Several different plasma etching technologies have been recently developed. One of the available etch processes is know as the Bosch process.

In another preferred embodiment, the process of bonding the SOI wafer and the substrate is performed at a predetermined pressure less than atmospheric pressure, for example, 200 mTorr. Thus, some gas can be present in the cavities between the Si and the substrate, but the gas pressure is not great enough to cause devices to explode during a subsequent potassium hydroxide (KOH) etch to remove the handle layer. This step avoids the need for drilling holes in the substrate ports to equalize the pressure between the internal cavities and outside of the wafer sandwich.

In a further preferred embodiment, the handle layer of the SOI wafer is removed by a relatively fast wet etch, for example, using potassium hydroxide (KOH). The fast etching of the handle layer is terminated at a predetermined distance, e.g., about 10 $\mu$m, from the $SiO_2$ layer. Removal of the rest of the handle layer is preferably done by a relatively slow etch, for example, using tetramethyl ammonium hydroxide (TMAH). Thus, the etch of the rest of the handle layer is preferably performed slowly and stops well at the $SiO_2$ layer. This etch can also be performed using $XeF_2$, which is a non-ionized gas that has a $Si:SiO_2$ etch ration as high as 10,000:1. The next step in the process is removal of the $SiO_2$ layer. In this as well as previous embodiments, removal of the $SiO_2$ layer is preferably performed using an RIE dry plasma etch process, so as not to attack the bulk glass and metallization on the topside of the device. The $SiO_2$ can be removed in an RIE tool using a recipe designed for $SiO_2$ etching. This process can be performed at desired gas pressure, such as 200 mTorr, which is substantially the same as the pressure at which the bonding of the SOI wafer and the substrate is performed. Thus, a differential pressure is not applied to the $SiO_2$ during the RIE etch, allowing the $SiO_2$ to be removed without damaging the device.

The previously described method requires the mesa etching and structural etching to be performed before the SOI wafer is bonded to a substrate wafer. Once the bonding has been performed, the handle layer part of the SOI wafer is removed using a wet etch. The wet etch which removes the handle layer must stop on the thin $SiO_2$ layer. If the etch does not completely stop at the $SiO_2$ layer, the etch chemicals would penetrate the device and destroy it. Also, the structural etching, which is performed before the SOI wafer is bonded to the substrate, defines cavities in the device layer. In these cavities, there is no Si underneath the $SiO_2$ to mechanically support the $SiO_2$ layer. During the etching process for removing the handle layer, the etch chemicals may penetrate the $SiO_2$ layer, which has no Si support, and destroy the device under the $SiO_2$ layer.

Figure 5:
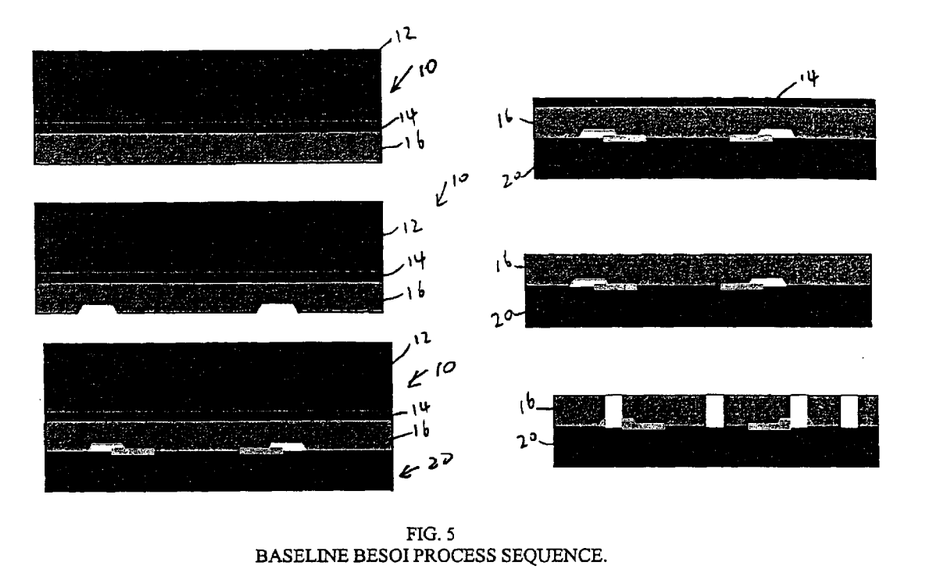
FIG. 5 is a schematic side drawing showing the baseline BESOI process sequence.

FIG. 5 illustrates an alternative fabrication method, which is called Bonded and Etch Back Silicon-On-Insulator (BESOI). In the BESOI method, the structural etching is performed after the SOI wafer is bonded to the substrate, and after the handle layer and $SiO_2$ layer are removed. When removing the handle layer, the $SiO_2$ layer is supported by the underlying Si across the complete surface of the SOI wafer. Thus the $SiO_2$ layer functions as a good etch stop, and no etch chemicals penetrate the device region when the handle layer of the SOI wafer is removed.

The BESOI method begins with a standard SOI wafer 10, similar to that used in the previously described SOI processes. First, the SOI wafer is cleaned and patterned for the mesa etch. The mesa etch may be preformed by several methods, for example, using KOH.

The glass substrate fabrication steps are similar to the previously described methods, which are outlined in FIG. 3. In one preferred embodiment, the glass substrate may be provided with access ports to equalize the pressure between the internal cavities and outside of the wafer sandwich.

Once the SOI and glass wafers have been processed, they are anodically bonded, with the device side of the SOI wafer bonded to the metallized side of the glass substrate. The bonding process also can be performed under a predetermined pressure, which is less than atmosphere pressure, as described above.

The handle layer of the SOI wafer is preferably removed by a relatively fast wet etch, for example, using potassium hydroxide (KOH). The etching of the handle layer is stoped at a predetermined distance, e.g., about 10 $\mu$m, from the $SiO_2$ layer. Removal of the rest of the handle layer is preferably done by a relatively slow etch, for example, using tetramethyl ammonium hydroxide (TMAH). The etch of the rest Si is preferably performed slowly and stops well on the $SiO_2$ layer. This etch can also be performed using $XeF_2$, which is a non-ionized gas that has a $Si:SiO_2$ etch ratio as high as 10,000:1.

The next step in the process is removal of the $SiO_2$ layer. In this as well as previously described embodiments, removal of the $SiO_2$ layer is preferably performed using an RIE dry plasma etch process. The $SiO_2$ can be removed in an RIE tool using a conventional recipe designed for $SiO_2$ etching.

After the $SiO_2$ layer is removed, the device layer is revealed and ready for structural etching. In a preferred form of the invention, the device layer is then etched to define the device preferably by Inductively Coupled Plasma (ICP), using a Surface Technology Systems plc (STS) machine, which prevents charge build-up causing "footing". The structural etching process may etch straight down to the glass substrate.

Figure 6A:
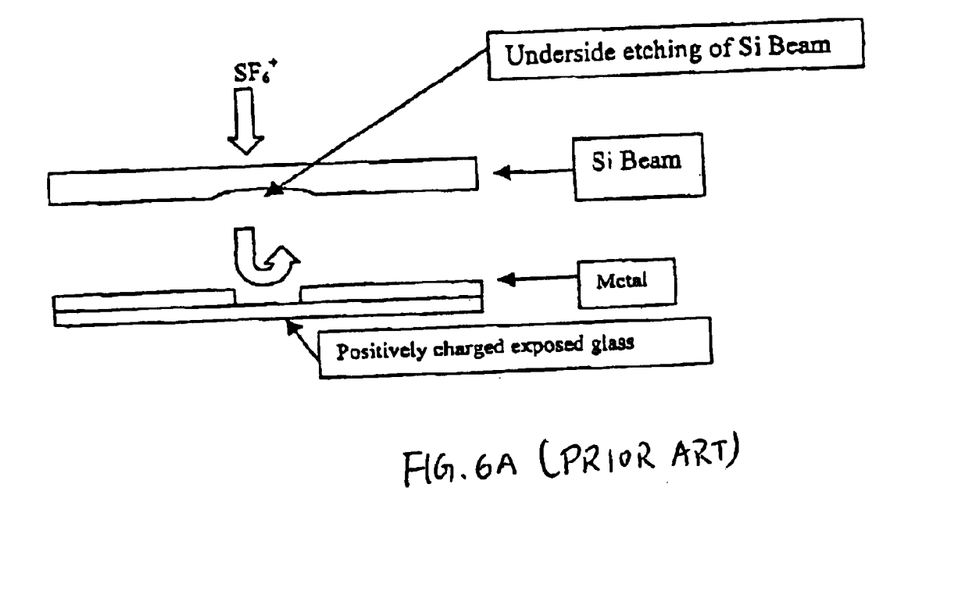
FIG. 6A is a schematic view of a prior art device structure showing that the underside of the Si beam is etched.

When the ICP etch is performed using a prior art process step, positive ions of $SF_6$ are generated in a region above the SOI wafer. These ions are accelerated by a negative potential applied to a bias plate upon which the SOI wafer is placed. The $SF_6$ ions subsequently etch the device layer of the SOI wafer. As the device layer is etched away, the underlying glass wafer is exposed. Electronic charge from the $SF_6$ ions may accumulate on the exposed glass. Once the exposed glass is positively charged, the positively charged incoming $SF_6$ ions are repelled. Their trajectory is bent such that they may etch and damage the underside of nearby Si. A diagram of this prior art process step is shown in FIG. 6A.

Figure 6B:
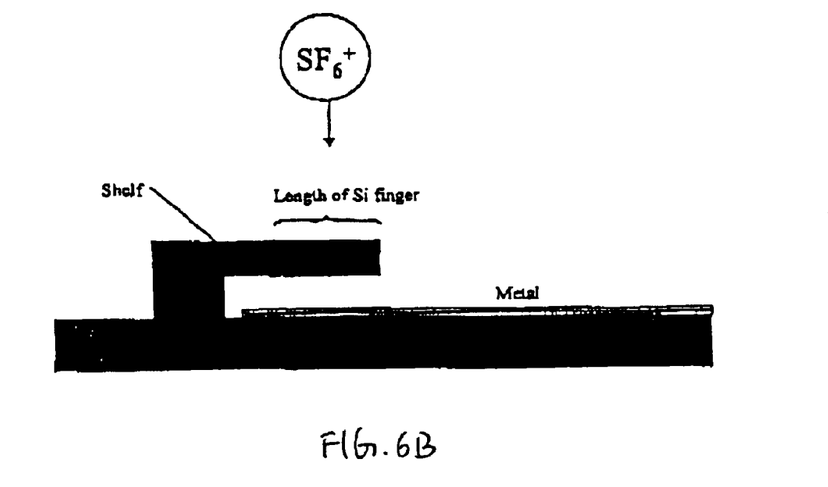
FIG. 6B is a schematic view of a device structure showing that the Si beam is protected from underside etching.

In accordance with the present invention, the above described prior art process step is replaced with a new process step, which avoids damage of the underside of the nearby Si of the device. With the improved step, the glass substrate is covered with a substantially uniform metal layer, which, during the etch, prevents charge build-up, as shown in FIG. 6B. Typically, gaps in metal layer are necessary to keep metal regions or lines separate. These gaps are preferably placed other than under an operable element which is to be formed by etching the device layer, or placed in areas where damage to the device will not affect the performance of the device. For example, as shown in FIG. 6B, the area directly underneath the drive or sense fingers of a MEMS device is covered by metal, and the gap between the Si and the metal is placed other than under the finger.

The ICP etch is performed after the SOI wafer is bonded to the glass substrate. The silicon, which is to be removed, is preferably not bonded to the glass, because it is very difficult for the ICP etch to remove Si, which has been bonded to the glass. To prevent the silicon, which will be removed by ICP etch, from bonding to the substrate glass, a few microns of the surface of the silicon are preferably removed before the SOI wafer is bonded to the glass wafer. The removal of the silicon can be done in the mesa etch, as shown in FIG. 2.

Figure 7:
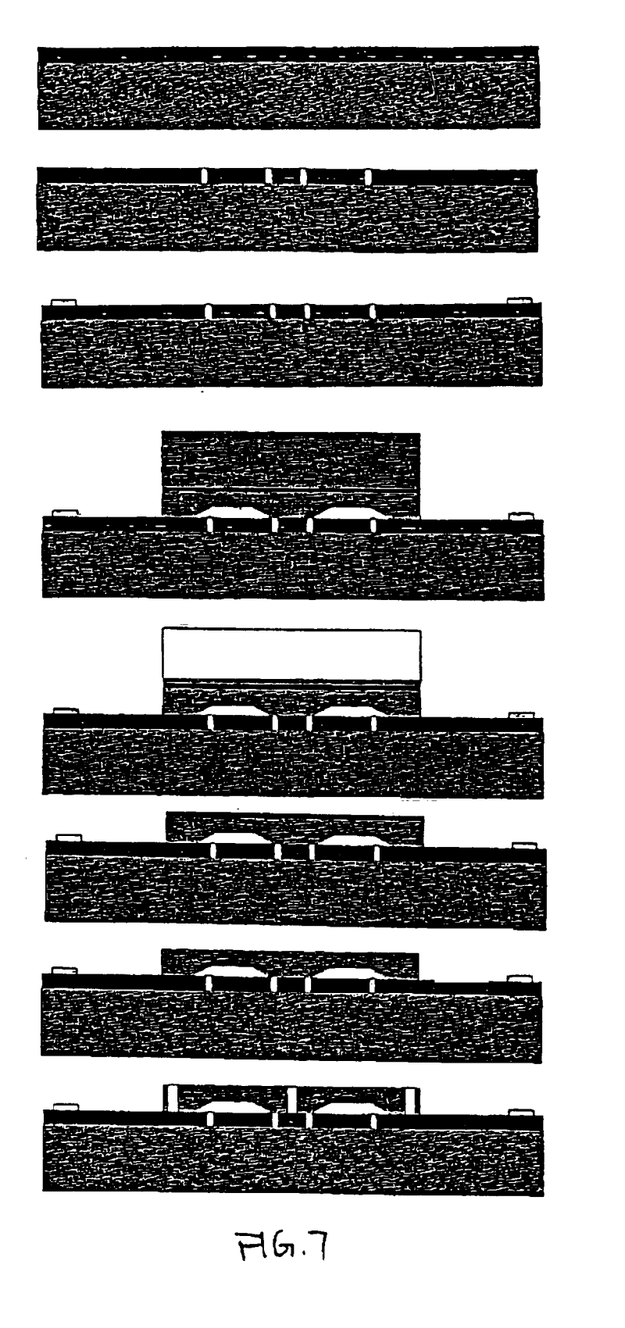
FIG. 7 is a schematic side view showing the baseline BESOI process sequence, wherein an SOI wafer is used as a substrate.

FIG. 7 illustrates another alternative BESOI method of the invention, which uses highly doped silicon or other crystalline substrates rather than a glass substrate. As shown in FIG. 7, a second SOI wafer is provided to be used as the substrate. The device layer of the second SOI wafer is etched straight down to the dielectric layer to form highly doped (and thus electrically conductive) "Si runners", which can be used as electrically conductive lines and contacts. After the "Si runners" are formed, the first etched SOI wafer is bonded to the second substrate SOI wafer. The substrate SOI wafer can be used in all previously described methods to replace the glass substrate.

Uses of the Invention. Commercial applications for this technology include, but are not limited to, inertial sensors for the automotive and other transport businesses, chemical and biological sensors for the biomedical and environmental monitoring businesses, industrial control sensors, actuators and components for the optoelectronics industry, and components for use in microfluidic applications aimed at biomedical and other technologies.

The invention is also useful in the manufacture of an accelerometer. An accelerometer pattern is etched into the SOI wafer. Guidance for making an accelerometer is provided in U.S. Pat. No. 6,269,696, "Temperature compensated oscillating accelerometer with force multiplier", issued Aug. 7, 2001 to Weinverg et al., incorporated herein by reference.

The details of one or more embodiments of the invention are set forth in the accompanying description above. Although any methods and materials similar or equivalent to those described herein can be used in the practice or testing of the present invention, the preferred methods and materials are now described. Other features, objects, and advantages of the invention will be apparent from the description and from the claims. In the specification and the appended claims, the singular forms include plural referents unless the context clearly dictates otherwise. Unless defined otherwise, all technical and scientific terms used herein have the same meaning as commonly understood by one of ordinary skill in the art to which this invention belongs. All patents and publications cited in this specification are incorporated by reference.

The following EXAMPLES are presented in order to more fully illustrate the preferred embodiments of the invention. These examples should in no way be construed as limiting the scope of the invention, as defined by the appended claims.

EXAMPLE

Fabrication Method for ALT BESOI Accelerometer

Summary. Several significant barriers to successful fabrication of the Silicon Oscillator Accelerometer using Silicon-On-Insulator (SOI) material have been encountered, necessitating the use of epitaxial material to build acceptable devices. Use of SOI rather than epitaxial material is strongly preferred for numerous reasons, including process flexibility, radiation hardness, performance, and IP issues. Here we show a method for an accelerometer device from SOI material. This process, coined the "ALT BESOI" process, appears to overcome current barriers to SOI processing.

Principal Advantages of SOI vs. Epitaxial Process. The driving force for using SOI material instead of epitaxial material to build the accelerometer is the greatly enhanced process flexibility afforded by the SOI process. For high performance, the best crystallographic quality is expected to produce the best devices. Device layers on SOI wafers can be of any doping level, type, crystallographic quality, etc. By contrast, epitaxial layers must be heavily-doped with boron. High doping concentrations of B are associated with etch pits, extended defects, curvature and strain, all undesirable features for strategic devices.

In addition to raw performance considerations, boost requirements require that the accelerometer be radiation hardened against fast neutrons, thermal neutrons and gamma radiation. Boron doping reduces hardness against thermal neutrons; therefore SOI material is preferred. More importantly, the glass substrate, whether PYREX® or Hoya SD-2, exhibits compaction under fast neutron and gamma irradiation [C. Allred, *Master's Thesis, MIT Materials Science and Engineering Department*, August 2000. Fabrication of an accelerometer built from SiGeB epitaxial material would be difficult to impossible with a silicon-on-silicon process, but would be very compatible with the use of SOI material for the device layer.

Process Difficulties with Baseline BESOI Process. Fabrication yields for the accelerometer were extremely low, partly due to the very large (>1 cm) die size, but also due to process problems with the baseline BESOI sequence.

Difficulties with this process are mainly associated with the final step in the process, in which the structural element is etched into the SOI device layer using the (Inductively Coupled Plasma) ICP etching process.

Figure 8:
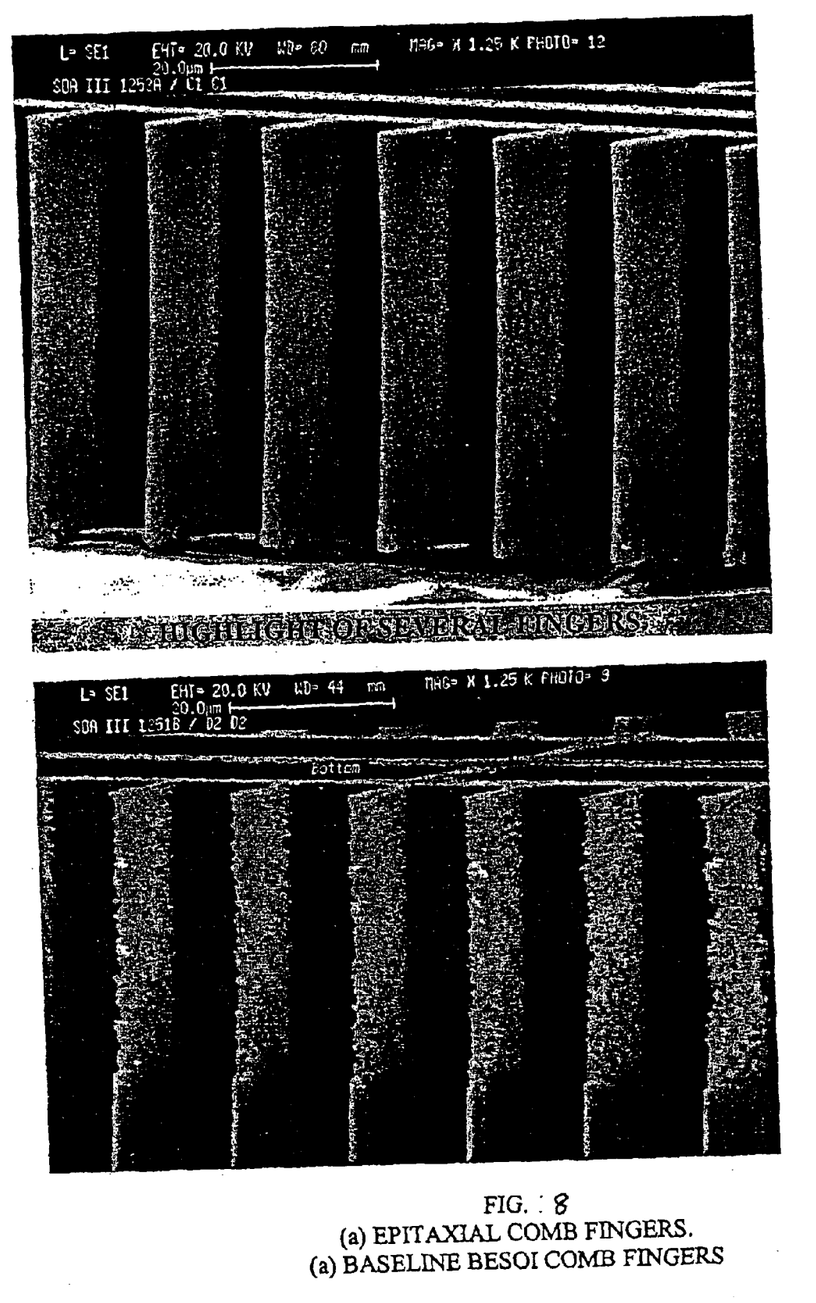
FIG. 8 is a set of electron micrographs showing (a) epitaxial comb fingers and (b) the baseline BESOI comb fingers.

Etching of the structural element in epitaxial processes occurs prior to bonding to the glass substrate. Therefore, the ICP etch must penetrate below the line of the SiGeB etch stop layer, so that subsequent backside wafer dissolution results in full release. When the ICP process stops in a silicon wafer, a phenomenon known as RIE lag, shown in FIG. 8, causes wide features to etch deeper than narrow features. However, this over-etch causes no serious harm, since wide features simply penetrates more deeply into the silicon wafer.

Figure 9:
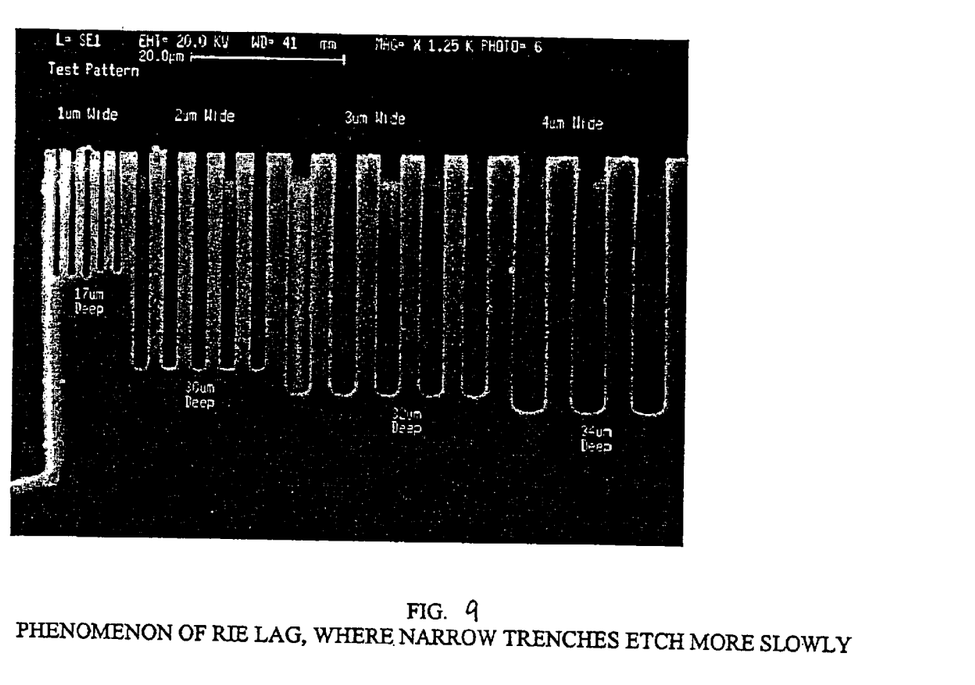
FIG. 9 is an electron micrograph showing the phenomenon of RIE lag, where narrow trenches etch more slowly.

By contrast, when the ICP etch stops on a substrate such as the glass, wide features cannot etch any deeper, and therefore the plasma attacks the underside of released features and forms notches near the silicon—glass interface. This phenomenon in illustrated in FIG. 9, where first SEM image shows what comb fingers should look like (epitaxial process), while the second SEM image shows comb fingers built using the standard BESOI process. Severe attack of the bottom of the comb fingers (comb is turned upside down for better visibility) is evident.

New ICP etch technology is specifically aimed at reducing notching and underside attack. However, the new technology is most effective when silicon is directly bonded to the non-etching substrate, such as glass or oxide. Alternatives attempted to date principally address the notching problem, and entail ICP etching down to the buried oxide layer prior to anodic bonding.

Process Difficulties with Initial Attempts at an Alternative SOI Process. High fidelity etching of the structural layer using an SOI wafer requires that the ICP process be conducted when the device layer is fully bonded to the oxide dielectric. The most obvious alternative SOI process therefore entails ICP etching prior to wafer bonding, followed by wafer thinning and oxide removal after the wafer bond.

Attempts to produce accelerometer devices using the sequence as modified above have not been successful. Basically, the oxide etch-stop mechanically fails during wafer thinning, resulting in attack of silicon underneath the etch-stop, and all devices are obliterated.

A re-design was performed, in which towers of silicon underneath the etch stop, but not connected to the device, could be inserted to insure mechanical survival during thinning. However, the most serious mechanical problem was the pressure differential between the internal cavities and the ambient. Since anodic bonding of the glass substrate is performed at 345° C., the pressure in the cavity at room temperature is, from the ideal gas law, $$P=nRT/V, \tag{1}$$

where n is the number of moles, R the universal gas constant, and V the volume, all fixed. Since anodic bonding is performed at atmospheric pressure, the internal cavity pressure at room temperature is P=(293 K/(273+345) K)~0.45 atm. Therefore, at room ambient, the cavity will tend to implode, while in a vacuum chamber, the cavity will tend to burst.

Basic Description of New ALT BESOI Process. Herein is presented a new, alternative BESOI process, coined "Alt BESOI." As the initial prototype alternative processes did, this new process differs from baseline BESOI in that ICP etching occurs prior to anodic bonding.

Four salient differences from initial prototype alternative BESOI processes are (1) ICP etch is conducted using newly available SOI etch technology, (2) A pressure relief hole is inserted in the glass to eliminate pressure differentials during wafer thinning, (3) Wafer thinning is accomplished using a dry plasma process rather than a wet etch, and (4) The die layout is adjusted to minimize the spacing between anchored features (without affecting the actual accelerometer design.)

Initially, a standard SOI wafer is provided, which is similar to that used in both the baseline and prototype alternative SOI processes. First, the SOI wafer is cleaned and patterned for the mesa etch. The mesa etch may be performed using KOH or other etchants. This represents yet-another advantage of the SOI process over its predecessors.

Once the mesa etch has been performed, the wafer is cleaned and patterned for the structural etch. Since the process etches straight down to the dielectric layer, which is bonded everywhere to the device layer, technology designed to prevent plasma etching problems at the dielectric—device interface becomes very effective.

In one embodiment, the SOI wafer, which has been patterned and etched through both the mesa and structural layers, is then bonded to a glass substrate. The glass substrate fabrication steps are outlined in FIG. 3. First, the glass wafer is cleaned and patterned for the electrode pattern. In this embodiment, the electrode pattern is composed of multilevel metallization. The glass wafer is then recess-etched, and, without removing the photoresist, a blanket sputter of the multilevel metallization is performed. Finally, the wafer undergoes "lift-off", where metal not applied directly to the substrate is removed.

The advantage of access ports is evident, as the substrate wafer is bonded to the processed SOI wafer. These access ports may be etched, or more preferably, mechanically or ultrasonically drilled through the glass. The spacing of these holes is determined by the die size and by the presence and distribution of bonded seals between the SOI wafer and the substrate. Since the purpose of the access ports is to equalize the pressure between the internal cavities and outside of the wafer sandwich, at least one such port must be positioned within each region sealed by bonding. Typically, these regions coincide with the die size, so that each device is isolated from all others by a bonded structure known as a seal ring.

Once the SOI and glass wafers have been processed, they are anodically bonded. The remainder of the process sequence is illustrated in FIG. 4. Note that the presence of the access port ensures that the inner cavities are at the same pressure as the external environment. Without this access port, the quantity of gas inside the cavity is fixed when the bond is formed.

Once the wafers have been bonded together, with the device side of the SOI wafer bonded to the metallized side of the glass, the handle layer of the SOI wafer must be removed. Without an access port, this material may be removed in a wet chemical etch or by a dry plasma etch. With the access port present, only the dry process may be used. For the present example, a RIE reactor may be used to remove the handle silicon layer. One required feature of RIE process tool is that it enables the plasma removal to occur with equalized pressure across the oxide dielectric. The other required feature is that plasma gases cannot gain access to the cavity through the port; otherwise, attack of structural layers would ensue.

The final step in the process is removal of the oxide dielectric. In this as well as previous embodiments, removal of the dielectric layer must be performed using a dry plasma etch process, so as not to attack the bulk glass and metallization on the topside of the device. Once the dielectric has been removed, the final structure is revealed. Excellent build quality is expected, based upon the use of the new ICP SOI etching technology and pressure equalization during thinning.

The foregoing description has been presented only for the purposes of illustration and is not intended to limit the invention to the precise form disclosed, but by the claims appended hereto.

We claim:

1. A method for producing micromachined devices, comprising the steps of:
   (a) obtaining a Silicon-On-Insulator (SOI) wafer, which comprises
      (i) a handle layer,
      (ii) a dielectric layer, and
      (iii) a device layer;
      wherein a mesa etch has been made on the device layer of the SOI wafer,
   (b) obtaining a substrate, wherein a pattern has been formed onto the substrate;
   (c) bonding the SOI wafer and the substrate together;
   (d) removing the handle layer of the SOI wafer;
   (e) removing the dielectric layer of the SOI wafer; and
   (f) after step (e), performing a structural etch on the device layer.

2. The method of claim 1, wherein the dielectric layer of the SOI wafer comprises silicon dioxide.

3. The method of claim 1, wherein the structural etch is a Deep Reactive Ion Etch.

4. The method of claim 1, wherein the substrate comprises at least one access port.

5. The method of claim 1, wherein the substrate is glass or silicon.

6. The method of claim 1, wherein the substrate is glass and the substrate pattern comprises multilevel metallization.

7. The method of claim 1, wherein the substrate is a recess-etched glass wafer.

8. The method of claim 7, further comprising the steps of
   (a) performing a blanket sputter of the multilevel metallization; and
   (b) lifting off the metal not directly applied to the substrate.

9. The method of claim 1, wherein the bonding of the SOI wafer and the substrate is anodic bonding.

10. The method of claim 1, wherein removing the handle layer of the SOI wafer comprises removing the handle layer of the SOI wafer by a wet chemical etch.

11. The method of claim 1, wherein removing the dielectric layer of the SOI wafer comprises removing the dielectric layer of the SOI wafer by a dry plasma etch.

12. The method of claim 1, wherein said substrate comprises an SOI wafer.

13. The method of claim 1, wherein the structural etch is straight down through the device layer to the substrate.

14. The method of claim 13, wherein the device layer is partially removed at the top surface at locus where the structural etch is to be performed straight down to the substrate, such that when the device layer is bonded to the substrate, the surface of the device layer at the locus is spaced apart from the substrate.

15. The method of claim 1, wherein said substrate includes a patterned metal layer deposited thereon, wherein the metal layer defines gaps, which are positioned other than under operable elements which is to be formed by etching the device layer.

16. The method of claim 1, wherein bonding the SOI wafer and the substrate together is performed under a predetermined pressure less than atmosphere pressure.

17. The method of claim 1, wherein removing the handle layer of the SOI wafer comprises:
   (a). removing the handle layer of the SOI wafer to a predetermined distance from the dielectric layer by a first etchant, wherein a relatively thin handle layer is left on the dielectric layer; and
   (b). removing the relatively thin handle layer by a second etchant.

18. The method of claim 17, wherein said first etchant is a relatively fast etchant.

19. The method of claim 17, wherein said second etchant is a relatively slow etchant.

20. The method of claim 17, wherein said first etchant is potassium hydroxide ($XeF_2$).

21. The method of claim 17, wherein said second etchant is xenon difluoride ($XeF_2$).

22. The method of claim 17, wherein said second etchant is tetramethyl ammonium hydroxide (TMAH).

23. A method for making an accelerometer, comprising the steps of:
   (a) obtaining a Silicon-On-Insulator (SOI) wafer, which comprises
      (i) a handle layer,
      (ii) a dielectric layer, and
      (iii) a device layer;
      wherein a mesa etch has been made on the device layer of the SOI wafer;
   (b) obtaining a substrate, wherein a pattern has been formed onto the substrate;
   (c) bonding the SOI wafer and the substrate together;
   (d) removing the handle layer of the SOI wafer;
   (e) removing the dielectric layer of the SOI wafer; and
   (f) after step (e), performing a structural etch on the device layer, such that the etches of the mesa etch and the structural etch provide a pattern for an accelerometer.

* * * * *